(12) United States Patent
Tercariol et al.

(10) Patent No.: US 12,712,357 B2
(45) Date of Patent: Aug. 18, 2026

(54) TRIGGER CIRCUIT FOR CONTROLLING AN ESD PROTECTION SWITCH

(71) Applicant: NEXPERIA B.V., Nijmegen (NL)

(72) Inventors: Walter Luis Tercariol, Nijmegen (NL); Justin Philpott, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 105 days.

(21) Appl. No.: 18/414,888

(22) Filed: Jan. 17, 2024

(65) Prior Publication Data

US 2024/0243569 A1 Jul. 18, 2024

Related U.S. Application Data

(60) Provisional application No. 63/480,125, filed on Jan. 17, 2023.

(51) Int. Cl.
*H02H 9/04* (2006.01)
*H03K 17/56* (2006.01)

(52) U.S. Cl.
CPC ............. *H02H 9/046* (2013.01); *H03K 17/56* (2013.01)

(58) Field of Classification Search
CPC .......... H02H 9/046; H02H 9/04; H02H 9/043; H03K 17/56; H10D 89/819; H10D 89/817
USPC ............................................................ 361/56
See application file for complete search history.

(56) References Cited

U.S. PATENT DOCUMENTS 6,064,556 A * 5/2000 Ravanelli ............. H10D 89/811 361/111
8,072,722 B1 * 12/2011 Hwang .................. H02H 9/046 361/56
8,482,891 B2 * 7/2013 Wu ........................ H02H 9/046 361/56
9,013,842 B2 * 4/2015 Domanski ............. H02H 9/046 361/56
9,923,527 B2 * 3/2018 McKay ................... H03F 3/193
10,177,137 B1 * 1/2019 Altolaguirre ........ H10D 89/817
11,411,396 B2 * 8/2022 Jiang .................... H10D 89/811
11,594,878 B2 * 2/2023 Ille ......................... H02H 9/046
11,916,026 B2 * 2/2024 Ahn ....................... H10D 89/819
2002/0118499 A1 * 8/2002 Gossner ............... H10D 89/811 361/56
2009/0161273 A1 * 6/2009 Li .......................... H02H 9/046 361/56
2012/0075757 A1 * 3/2012 Chen .................... H10D 89/819 361/56
2012/0188016 A1 * 7/2012 Hunt ..................... H03F 3/3028 330/269

(Continued)

FOREIGN PATENT DOCUMENTS

CN 102315633 A * 1/2012
CN 104037748 A * 9/2014
DE 102016111036 A1 * 12/2017 .............. H02M 3/06

*Primary Examiner* — Dharti H Patel
(74) *Attorney, Agent, or Firm* — Ruggiero McAllister & McMahon LLC

(57) ABSTRACT

A trigger circuit for controlling a electrostatic discharge (ESD), protection switch is provided. The present disclosure further relates to a high-voltage trigger circuit for use in eFuse (electronic fuse), load switch or ideal diode applications, or in any other application with a large n-channel FET between two pins. The trigger circuit ensures that the ESD protection gate can be left floating after the ESD event.

19 Claims, 4 Drawing Sheets

(56) References Cited

U.S. PATENT DOCUMENTS

| | | | | |
|---|---|---|---|---|
| 2013/0200460 | A1* | 8/2013 | Chuang ................ | H10D 89/811 257/358 |
| 2015/0288173 | A1* | 10/2015 | Chen ...................... | H02H 9/046 361/56 |
| 2017/0069618 | A1* | 3/2017 | Altolaguirre ........ | H10D 84/403 |
| 2018/0337170 | A1* | 11/2018 | Kanawati ............... | H02H 9/046 |
| 2020/0059092 | A1* | 2/2020 | Lee ......................... | G06F 3/044 |

* cited by examiner 303
318
317
304
302
316
315
306
301
305
300
310

TRIGGER CIRCUIT FOR CONTROLLING AN ESD PROTECTION SWITCH

CROSS-REFERENCE TO RELATED APPLICATIONS

This application claims the benefit under 35 U.S.C. § 119 (e) of U.S. Provisional Application No. 63/480,125 filed Jan. 17, 2023, the contents of which s are incorporated by reference herein in their entirety.

BACKGROUND

1. Field of the Disclosure

The present disclosure generally relates to electrostatic discharge, ESD, protection. Particular embodiments relate to a trigger circuit for controlling an ESD protection switch.

2. Description of the Related Art

During an ESD HBM event current must be shunted between pins without overstressing any devices in the path. This can be achieved by placing either dedicated protection devices or by utilizing existing devices to safely shunt the current. The ESD protection scheme must not interfere with the normal operation of the product. One method to protect the die is to use active ESD protection. When the voltage of the input terminal rises due to the ESD current, the input of a controlling circuit remains low due to an RC low pass filter. Thus, a PMOS or NMOS turns on allowing an NMOS or PMOS ESD protection switch respectively to turn on. Active ESD protection is advantageous as its operation can be simulated with circuit simulation tools. However, the conventional solution does not leave the gate floating after the ESD event.

SUMMARY

Therefore, it is an aim of at least some embodiments according to the present disclosure to ensure that the ESD protection gate can be left floating after the ESD event.

Accordingly, there is provided in a first aspect according to the present disclosure a trigger circuit for controlling an electrostatic discharge, ESD, protection switch. The trigger circuit comprises: an input terminal arranged to be connected with a first conduction terminal of the ESD protection switch; an output terminal arranged to control a control terminal of the ESD protection switch; a first diode function biased from the output terminal to the input terminal; a second diode function biased from the input terminal to the output terminal and connected in series with the first diode function; a first transistor having two conduction terminals and a control terminal; wherein the two conduction terminals of the first transistor are arranged in parallel with the first diode function and wherein the control terminal of the first transistor is configured for controlling a conduction path between the two conduction terminals of the first transistor; and a first timer circuit comprising: a first resistor connected in series between the control terminal of the first transistor and the output terminal; a first capacitor connected in series between the control terminal of the first transistor and the input terminal.

The second diode function is connected in series between the input terminal and one of the two conduction terminals of the first transistor. The control terminal of the first transistor is coupled via the first capacitor to the input terminal, such that a rising voltage at the input terminal due to an ESD event triggers the control terminal of the first transistor to activate the conduction path between the two conduction terminals of the first transistor. The first capacitor is arranged to be discharged through the first resistor to the output terminal such that, when the first capacitor is discharged below a first threshold of the first transistor, the control terminal of the first transistor deactivates the conduction path between the two conduction terminals of the first transistor.

In this context, a diode function being biased from a first element to a second element may be taken to mean that a diode of the diode function is oriented such that the anode of the diode is directed towards the first element and the cathode of the diode is directed towards the second element. It is noted that this does not necessarily exclude that other, specified or unspecified elements may be present between the anode and the first element or between the cathode and the second element. Moreover, and more generally, if a device is connected in series between a first element and a second element, this does not necessarily exclude that other, specified or unspecified elements may be present between the device and either or both of the first element and the second element. It is up to the skilled person to safeguard that these other, specified or unspecified elements do not disturb the essential function of the described elements.

In an embodiment, a relationship between a charge capacity of the first capacitor and the first threshold of the first transistor and a gate capacitance of the first transistor is configured to keep the first transistor activated for at least a duration of the ESD. In this manner, the first transistor can be activated (i.e. turned on) for the duration of the ESD event, and can thus adequately deal with the ESD.

In an embodiment, the first transistor is a laterally-diffused metal-oxide semiconductor, LDMOS, or an extended drain field-effect transistor, EDFET. In a preferred embodiment, the first transistor is a laterally-diffused n-channel metal-oxide semiconductor, LDnMOS; or an n-channel extended drain field-effect transistor, EDFET.

In an embodiment, ESD protection switch comprises a transistor having a maximum drain-to-source voltage rating of substantially 18 V; and/or a maximum gate-to-source voltage rating of substantially 5.5 V. In this context, "substantially" may be taken to mean "within at least 20% of".

In an embodiment, the first capacitor has a charge capacity of at least 18 V.

In an embodiment, the output terminal is configured to float when the conduction path between the two conduction terminals of the first transistor is deactivated.

In an embodiment, the second diode function is implemented using a separate second diode, and the first capacitor is connected to a cathode of the separate second diode.

In another embodiment, the second diode function is implemented using a separate second diode, and the first capacitor is connected to an anode of the separate second diode.

In yet another embodiment, the trigger circuit comprises: a second transistor having two conduction terminals and a control terminal; wherein the two conduction terminals of the second transistor are arranged in parallel with the second diode function and wherein the control terminal of the second transistor is configured for controlling a conduction path between the two conduction terminals of the second transistor; and a second timer circuit. The second timer circuit comprises: a second resistor connected in series between the control terminal of the second transistor and the input terminal; and a second capacitor connected in series between the control terminal of the second transistor and the input terminal, and connected in parallel with the second resistor. The control terminal of the second transistor is connected via the first capacitor to the control terminal of the first transistor. The control terminal of the second transistor is coupled via the second capacitor to the input terminal, such that a rising voltage at the input terminal due to an ESD event triggers the control terminal of the second transistor to activate the conduction path between the two conduction terminals of the first transistor. The second capacitor is arranged to be discharged through the second resistor to the input terminal such that, when the second capacitor is discharged below a second threshold of the second transistor, the control terminal of the second transistor deactivates the conduction path between the two conduction terminals of the second transistor.

In an embodiment, a relationship between a charge capacity of the second capacitor and the second threshold of the second transistor is configured to keep the first transistor activated for at least a duration of the ESD.

In an embodiment, the second transistor is a laterally-diffused metal-oxide semiconductor, LDMOS; or an extended drain field-effect transistor, EDFET. In a preferred embodiment, the second transistor is a laterally-diffused n-channel metal-oxide semiconductor, LDnMOS; or an n-channel extended drain field-effect transistor, EDFET.

In an embodiment, the first diode function is implemented using a parasitic diode of the first transistor.

In an embodiment, the second diode function is implemented using a parasitic diode of the second transistor.

BRIEF DESCRIPTION OF THE DRAWINGS

It will be understood that the above-described embodiments are intended merely to illustrate the principles of the present disclosure and are not intended to be interpreted in a limiting manner. The present disclosure will be more fully understood with the help of the following description and the appended drawings, in which.

DETAILED DESCRIPTION

The present disclosure relates to a high-voltage trigger circuit for use in eFuse (electronic fuse), load switch or ideal diode applications, or in any other application with a large n-channel FET between two pins. When an HBM (Human Body Model) or MM (Machine Model) event occurs between the input and output, the large pass FET (Field Effect Transistor) is turned on thus protecting it. Thus the ESD (Electrostatic Discharge) current is shunted from the input to the output of the device without damage occurring. During 'normal' operation, the gate of the FET should be left floating, allowing it to be driven by other (non-ESD) circuits. To protect against ESD zaps from input to output of the device, the ESD protection switch will be turned on using the trigger circuit. Note that for ESD zaps from output to input, the parasitic body-drain diode will conduct the HBM current. When there's an HBM zap between input and output, the ESD protection switch is used to conduct the ESD current. A trigger circuit is needed which will not interfere with the normal operation of the ESD protection device. In regular operation, input can be at 12 V and gate can be pumped to 17 V, so this is a design constraint. When the ESD protection switch is on, the input and output can be at 12 V, the gate will be at 17 V. When the ESD protection switch is off, the input can be at 12 V and the output (and gate) can be at any voltage from 0 V to 12 V. In normal mode, the trigger circuit must leave the gate of the ESD protection switch floating so it can be driven by a driver circuit (e.g. attached to terminal 427). The gate of the ESD protection switch can be higher or lower than the drain (IN)—the trigger circuit must be able to tolerate this.

In some embodiments, there is provided an ESD high-voltage trigger circuit for self-protecting FETs. The trigger circuit will turn on the FET when there's an HBM event but will leave the gate floating during normal mode. This will allow the gate to be driven by other non-ESD circuits (e.g. gate driver or charge-pump). The duration that the transistor or transistors will be kept on is easily adjustable by changing the resistor and capacitor values in the circuit. The trigger circuit may in particular be used when the FET's gate can be high or lower than the drain for normal mode. The trigger circuit is applicable for high-voltage or low-voltage applications. The trigger circuit can be simulated with circuit simulation tools (e.g., HSPICE, Spectre) and can be easily implemented in different technologies.

The ESD protection switch is a low-Ohmic device. The FET width (and therefore silicon area) is very large.

Figure 1:
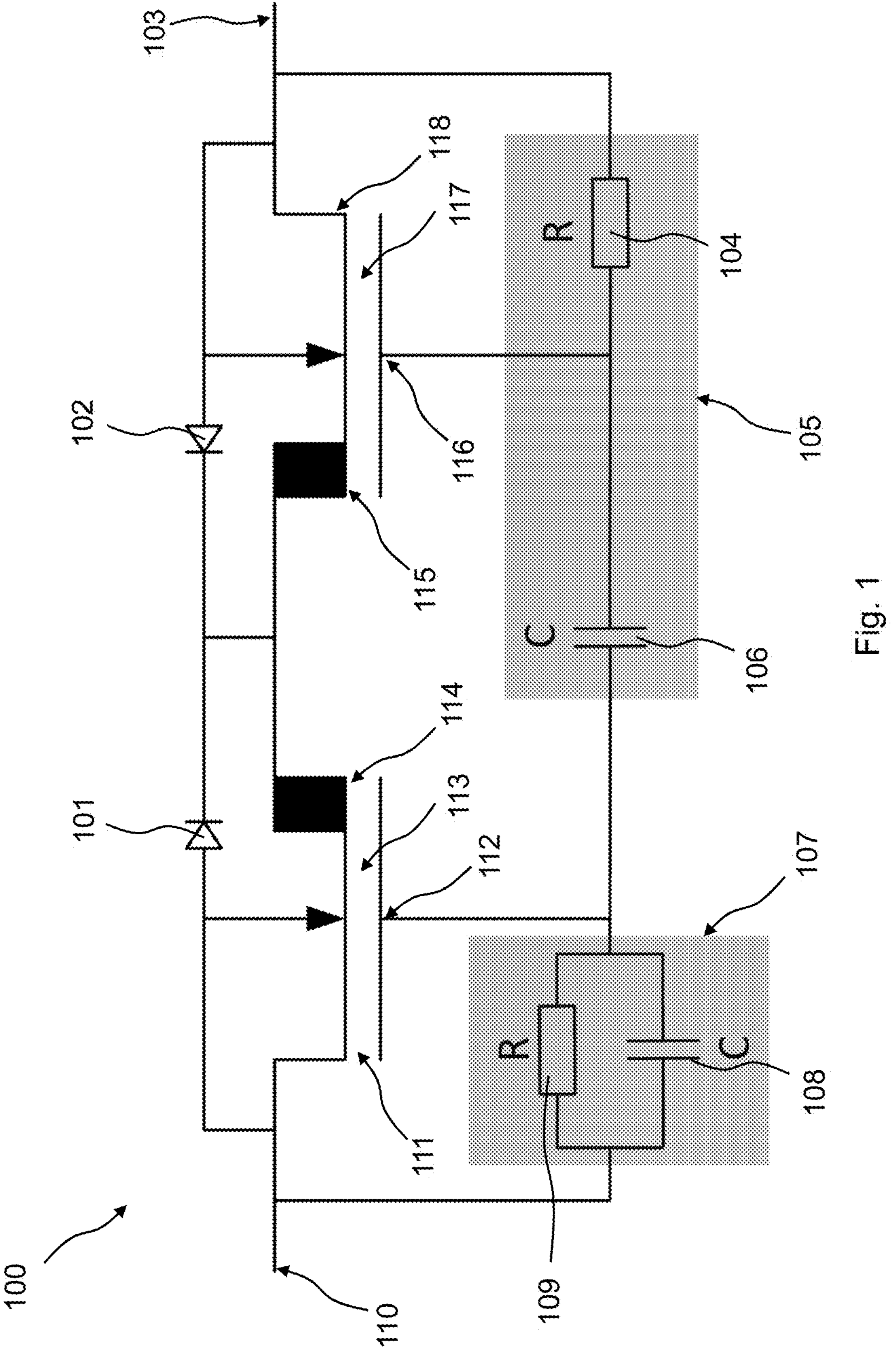
FIG. 1 schematically illustrates a first embodiment of a trigger circuit according to the present disclosure.
Figure 4:
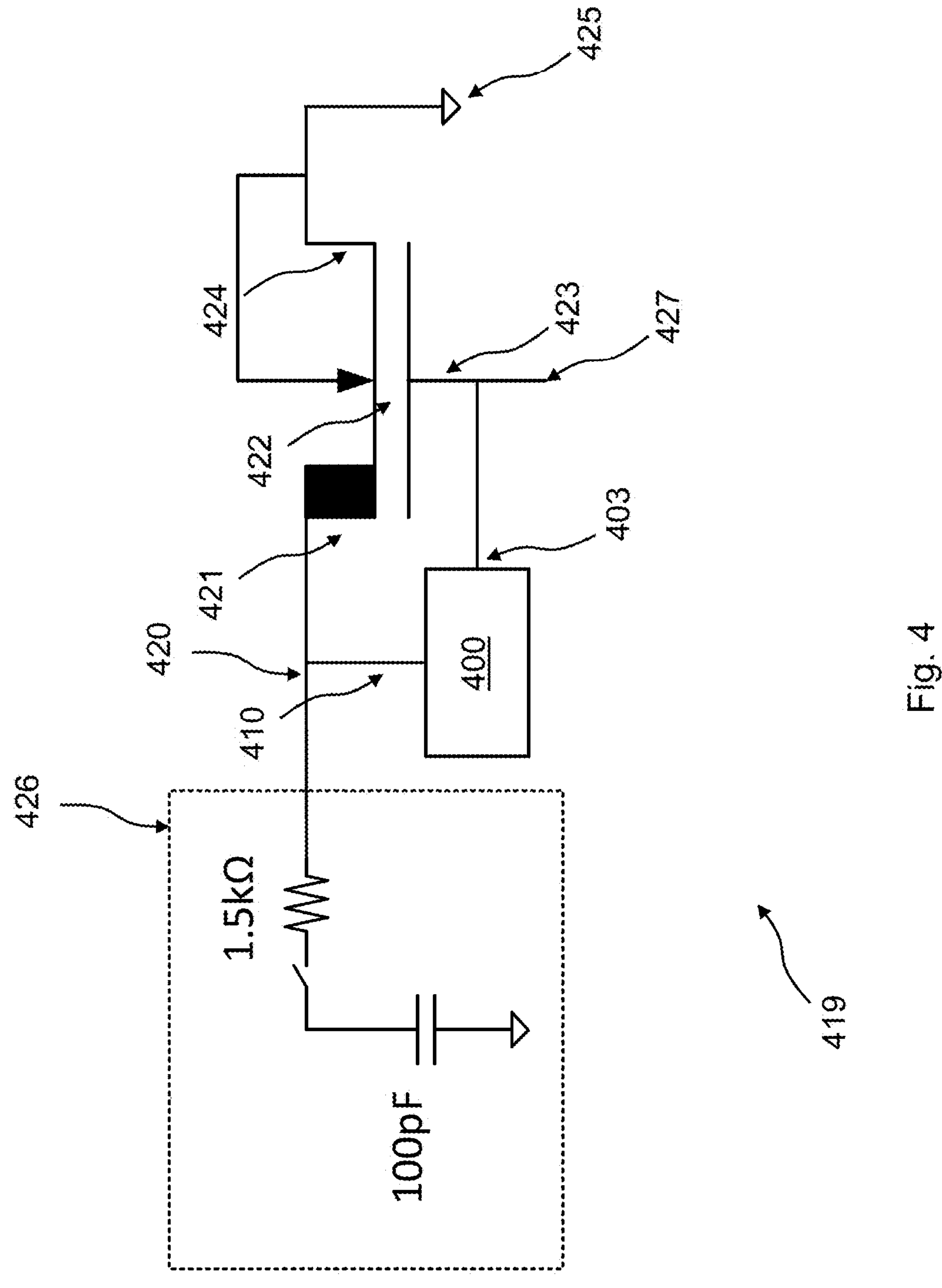
FIG. 4 schematically illustrates an electronic device comprising an ESD protection switch and a fourth embodiment of a trigger circuit according to the present disclosure.

FIG. 1 schematically illustrates a first embodiment of a trigger circuit 100 according to the present disclosure, which is suitable for controlling an electrostatic discharge, ESD, protection switch (not shown in FIG. 1, but analogous to switch 422 in FIG. 4). The trigger circuit 100 comprises:

- an input terminal 110 arranged to be connected with a first conduction terminal of the ESD protection switch;
- an output terminal 103 arranged to control a control terminal of the ESD protection switch;
- a first diode function 102 biased from the output terminal 103 to the input terminal 110;
- a second diode function 101 biased from the input terminal 110 to the output terminal 103 and connected in series with the first diode function 102;
- a first transistor 117 having two conduction terminals 115, 118 and a control terminal 116; wherein the two conduction terminals 115, 118 of the first transistor 117 are arranged in parallel with the first diode function 102 and wherein the control terminal 116 of the first transistor 117 is configured for controlling a conduction path between the two conduction terminals 115, 118 of the first transistor 117;
- a first timer circuit 105 comprising:
- a first resistor 104 connected in series between the control terminal 116 of the first transistor 117 and the output terminal 103;
- a first capacitor 106 connected in series between the control terminal 116 of the first transistor 117 and the input terminal 110;

wherein the second diode function 101 is connected in series between the input terminal 110 and one of the two conduction terminals 115 of the first transistor 117;

wherein the control terminal 116 of the first transistor 117 is coupled via the first capacitor 106 to the input terminal 110 (of course there may be other elements in between the first capacitor 106 and the input terminal 110), such that a rising voltage at the input terminal 110 due to an ESD event triggers the control terminal 116 of the first transistor 117 to activate the conduction path between the two conduction terminals 115, 118 of the first transistor 117; and wherein the first capacitor 106 is arranged to be discharged through the first resistor 104 to the output terminal 103 such that, when the first capacitor 106 is discharged below a first threshold of the first transistor 117, the control terminal 116 of the first transistor 117 deactivates the conduction path between the two conduction terminals 115, 118 of the first transistor 117.

The first diode function 102 and the second diode function 101 may in other words be arranged in a back-to-back configuration, such that they share terminals 115 and 114 of the first transistor and the second transistor.

It is noted that either or both of the first diode function 102 and the second diode function 101 may be implemented using a parasitic diode, i.e. the diode function inherently present in the transistor, or either or both may be implemented using a separate diode arranged in parallel with this parasitic diode. In either case, the arrangement achieves a "diode function".

Figure 2:
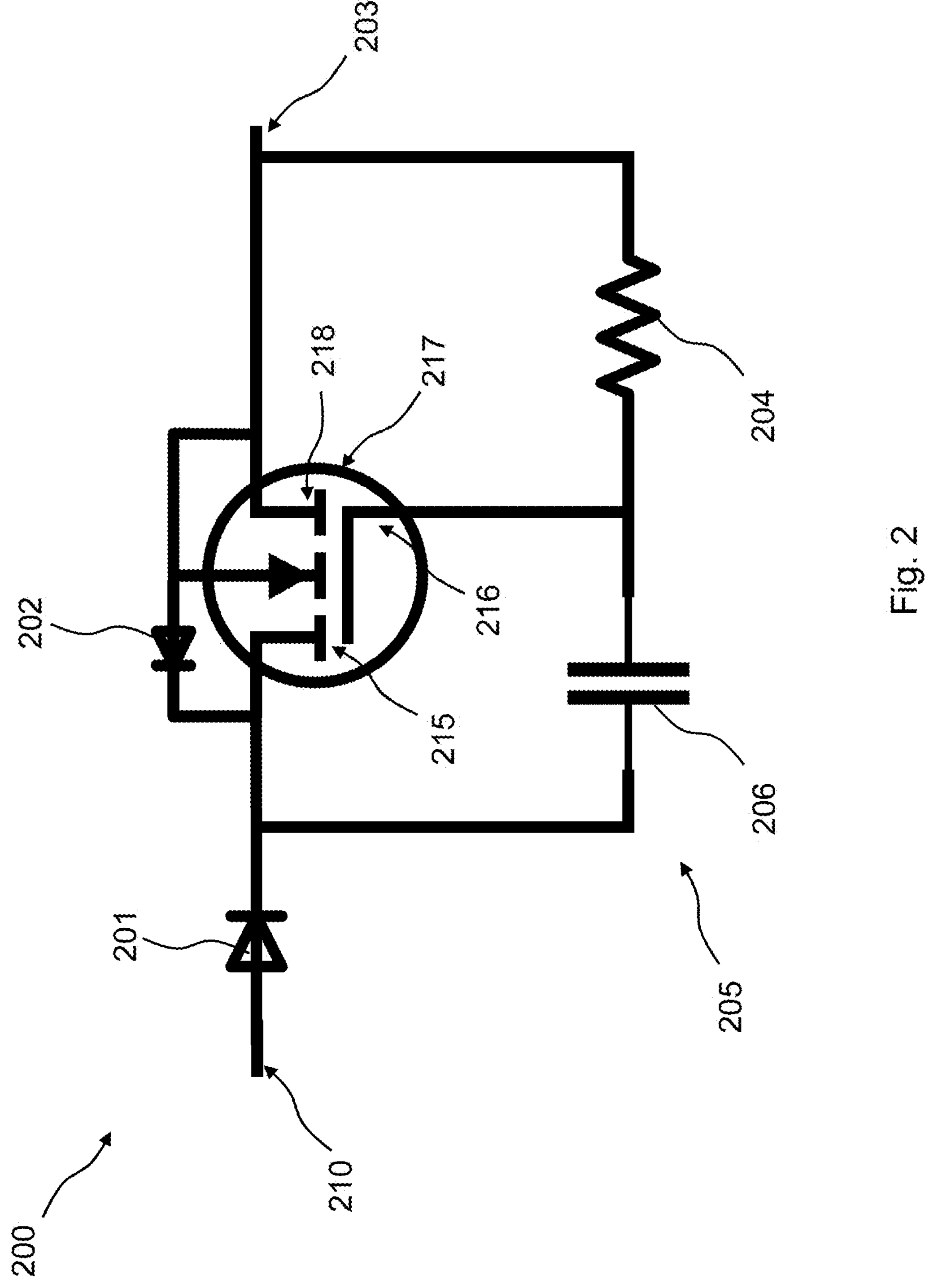
FIG. 2 schematically illustrates a second embodiment of a trigger circuit according to the present disclosure.
Figure 3:
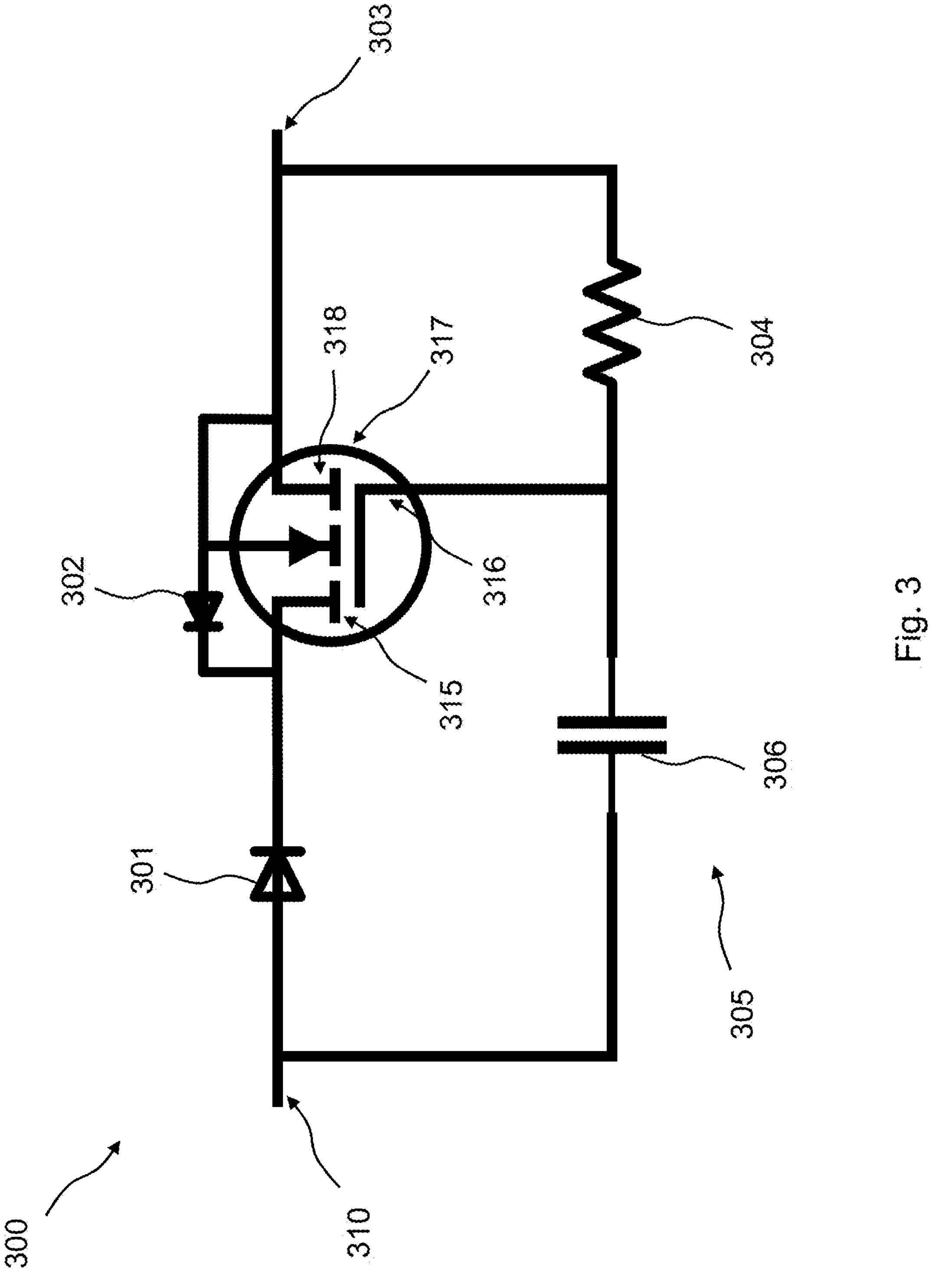
FIG. 3 schematically illustrates a third embodiment of a trigger circuit according to the present disclosure.

The trigger circuit 100" of FIG. 1 may additionally comprise the following components, which the skilled person will appreciate to be optional in view of the second and third embodiment as shown in FIGS. 2 and 3:

- a second transistor 113 having two conduction terminals 111, 114 and a control terminal 112; wherein the two conduction terminals 111, 114 of the second transistor 113 are arranged in parallel with the second diode function 101 and wherein the control terminal 112 of the second transistor 113 is configured for controlling a conduction path between the two conduction terminals 111, 114 of the second transistor 113; and
- a second timer circuit 107;

wherein the second timer circuit 107 comprises:

- a second resistor 109 connected in series between the control terminal 112 of the second transistor 113 and the input terminal 110; and
- a second capacitor 108 connected in series between the control terminal 112 of the second transistor 113 and the input terminal 110, and connected in parallel with the second resistor 109;

wherein the control terminal 112 of the second transistor 113 is connected via the first capacitor 106 to the control terminal 116 of the first transistor 117;

wherein the control terminal 112 of the second transistor 113 is coupled via the second capacitor 108 to the input terminal 110, such that a rising voltage at the input terminal 110 due to an ESD event triggers the control terminal 112 of the second transistor 113 to activate the conduction path between the two conduction terminals 111, 114 of the first transistor 113; and wherein the second capacitor 108 is arranged to be discharged through the second resistor 109 to the input terminal 110 such that, when the second capacitor 108 is discharged below a second threshold of the second transistor 113, the control terminal 112 of the second transistor 113 deactivates the conduction path between the two conduction terminals 111, 114 of the second transistor 113.

FIG. 2 schematically illustrates a second embodiment of a trigger circuit 200 according to the present disclosure. The trigger circuit of FIG. 2 is similar to that of FIG. 1, except in that the function of the second transistor 113 of FIG. 1 has been taken over by the second diode function 201 wherein the second diode function 201 is implemented using a separate second diode 201, in such a way that the first capacitor 206 is connected to a cathode of the separate second diode 201. Here too, the FET may return to the off-state when the ESD event is over.

FIG. 3 schematically illustrates a third embodiment of a trigger circuit 300 according to the present disclosure. The trigger circuit of FIG. 3 is similar to that of FIG. 1, except in that the function of the second transistor 113 of FIG. 1 has been taken over by the second diode function 301 wherein the second diode function 301 is implemented using a separate second diode 301, in such a way that the first capacitor 306 is connected to an anode of the separate second diode 301. Here too, the FET may return to the off-state when the ESD event is over.

FIG. 4 schematically illustrates an electronic device 419 comprising an ESD protection switch and a fourth embodiment of a trigger circuit 400 according to the present disclosure. The trigger circuit 400 may for example be analogous to trigger circuit 100 of FIG. 1, or to trigger circuit 200 of FIG. 2, or to trigger circuit of FIG. 3, or to other, similar trigger circuits within the ambit of the trigger circuit according to the present disclosure.

Trigger circuit 400 comprises an input terminal 410 arranged to be connected with a first conduction terminal 421 of the ESD protection switch 422; and an output terminal 403 arranged to control a control terminal 423 of the ESD protection switch 422.

The first conduction terminal 421 of the ESD protection switch 422 and the input terminal 410 of the trigger circuit 400 are electrically connected to the input 420 of the electronic device 419, which is usually denoted as $V_{CC}$.

An HBM (Human Body Model) ESD (Electrostatic Discharge) 426 is modelled via a 100 pF capacitor connected to ground, connected in series to a switch, connected in series to a 1.5 kΩ resistor. Of course, the details of this model 426 are not intended to limit the embodiments according to the present disclosure.

During an HBM event between $V_{CC}$ 420 and the second conduction terminal 424 of the ESD protection switch 422, the control terminal 423 (gate) of the ESD protection switch 422 is shorted to the $V_{CC}$ node 420, thus activating the ESD protection switch. Without this feature, the buildup voltage on the first conduction terminal 421 (drain) of the ESD protection switch 422 might rise above the maximum rating of the FET and permanent damage could occur. When $V_{GS}$ of the FET is above the threshold voltage, the FET will turn on and conduct the ESD current. Because Mx is used during the product's normal operation, the trigger circuit must leave the gate floating in 'normal mode'. This will allow the gate 423 to be driven by other (non-ESD) circuits.

During an HBM event between the $V_{CC}$ node 420 and the output node 425 of the electronic device 419, the voltage of the $V_{CC}$ node 420 will rise quickly, while the second conduction terminal 424 (source) of the ESD protection switch 422 is grounded to ground 425.

For the following operation of an embodiment according to the present disclosure, reference will be made to the first embodiment 100 of FIG. 1 as well as to the fourth embodiment of FIG. 4, where appropriate. Through capacitor coupling of the first capacitor 106 and the optional second capacitor 108, the voltage at the control terminal 116 of the first transistor 117 and at the control terminal 112 of the optional second transistor 113 will also rise quickly. The first transistor 117 will turn on when its gate-to-source voltage rises above a threshold voltage, so $V_{GS,117}>V_{th,117}$.

During an ESD event the input terminal 110 rises quickly. The control terminal 112 of the second transistor 113 is coupled high through the second capacitor 108. In addition, the control terminal 116 of the first transistor 117 is also coupled high through the capacitor 106. The first transistor 117 conducts when the control terminal voltage 116 is above a threshold voltage. The second transistor 113 conducts when the control terminal voltage 112 is above a threshold voltage. In addition there will be current conduction through the second diode function 101. When the ESD event is over, the first capacitor 106 is discharged through the first resistor 104 to the output terminal 103. In parallel the second capacitor 108 is discharged through the second resistor 109 to the input terminal 110. Thus $Vgs_{113}=0$ & $VGS_{117}=0$ and there is no conduction path between the input terminal 110 and the output terminal 103 of the trigger circuit.

The first capacitor 106 is preferably a high voltage capacitor, as the voltage across this capacitor can become very high. In an example implementation, it can be as high as 18 V. The $V_{CC}$ node 420 and the output terminal 403 of the trigger circuit 400 are shorted together, and the control terminal 423 (gate) of the ESD protection switch 422 rises. Because the transconductance gm of the ESD protection switch 422 is very large (as the FET width (and therefore silicon area) is very large), the control terminal 423 (gate) does not need to rise by much for all the HBM current to be shunted.

A first and second timer circuit 105, 107, implemented in this example as simple RC networks, are connected to the control terminals 112, 116 of the first 117 and second 113 transistors, and are dimensioned to ensure that the first 117 and second 113 transistors remain on for the duration of the HBM event.

The input terminal 110 and the control terminal 112 of the second transistor 113 are shorted when the HBM event has finished ($V_{GS,113}=0$). The output terminal 103 (connectable to the control terminal 423 of the ESD protection switch 422, as shown in FIG. 4) and the control terminal 116 of the first transistor 117 are shorted when the HBM event has finished ($V_{GS,117}=0$).

During normal mode, $V_{GS}$ of the first 117 and second 113 transistors are both 0 (the resistors 104, 109 ensure this). In that case, there is no conduction path between the input terminal 110 and the output terminal 103. The control terminal 423 (gate) of the ESD protection switch 422 can now be driven by other non-ESD circuits.

The first 117 and second 113 transistors may be used to short the gate 423 and drain 421 of the ESD protection switch 422 when an ESD event occurs. The gate 423 and drain 421 are fully independent and can have a voltage over the following ranges:

Drain 421: 0 V→18 V.

Gate 423: 0 V→V(drain 421)+5 V.

The large voltage difference between the two nodes (gate 423 and drain 421) means that the first 117 and second 113 transistors are preferably LDMOS devices. Because V(gate 423) can be large or smaller than V(drain 421), back-to-back LDMOS devices are preferred. This is to prevent body-drain diodes from forward biasing since LDMOS devices always have the body and source connected. However, the transistors can also be other types of devices, but the device chosen should be able to withstand high voltage drops across it (e.g. a voltage drop of 18 V). For example an extended drain field-effect transistor (EDFET) can also be used. These have the same voltage limitations as LDMOS devices.

In a first specific context, the voltage range of drain 421 can be from 0 to 12 V, and the voltage range of gate 423 can be from 0 to V(drain 421)+5 V. The first transistor 117 is therefore required to be high voltage—when the eFuse is off, V(drain 421)=12 V and V(gate 423)=0 V, there will be approximately 12 V across this FET. The second transistor 113 does not need to be an HV (High Voltage) device. When the eFuse is on, gate 423 is 5 V above drain 421, therefore there won't be more than 5 V across the second transistor 113. In general, for low voltage applications where V(drain 421)=0 to 5 V and V(gate 423) is 0 to V(drain 421)+5 V, lower voltage devices can be used (e.g. 5 V devices, as this is the maximum of $V_{gs}$, $V_{gd}$, $V_{ds}$).

If these diodes were forward biased, there would be a connection between drain 421 and gate 423, and they would not be independent. It is desirable to drive gate 423 higher than the source 424 of the ESD protection switch 422. If the diodes are between gate 423 and drain 421 (that is, diodes facing left in the orientation of FIG. 4), the internal driver trying to pull the gate 423 high would be fighting against external supply from drain 421. It will not be able to pull up more than two diode drops above the voltage of drain 421. In addition, if drain 421 is high and the ESD protection switch 422 needs to be turned off, gate 423 should be pulled low (so $V_{gs}$ of the ESD protection switch 422 is 0 V). This would be impossible if the diodes are between drain 421 and gate 423 (that is, diodes facing right in the orientation of FIG. 4) because the internal pull-down on gate 423 would be fighting against external supply from drain 421, and drain 421 would win.

It is noted that the first and second timer circuits may function as two separate timers: when the voltage at drain 421 (equal to the voltage at node 420) rises, the voltages at the control terminals 116 and 112 of the first 117 and second 113 transistors also rise through the first 106 and second 108 capacitors. After dealing with the ESD event, the voltage at the control terminal 112 of the second transistor 113 will drop to the voltage at the input terminal 110, which is equal to the voltage at drain 421, due to the second resistor 109, and the voltage at the control terminal 116 of the first transistor 117 will also drop to the voltage at the output terminal 103, which is equal to the voltage at gate 423, due to the first resistor 104.

LIST OF REFERENCE NUMBERS

100 trigger circuit
101 second diode function
102 first diode function
103 output terminal
104 first resistor
105 first timer circuit
106 first capacitor
107 second timer circuit
108 second capacitor
109 second resistor
110 input terminal
111 first conduction terminal of second transistor
112 control terminal of second transistor
113 second transistor
114 second conduction terminal of second transistor
115 first conduction terminal of first transistor
116 control terminal of first transistor
117 first transistor
118 second conduction terminal of first transistor
200 trigger circuit
201 second diode function
202 first diode function
203 output terminal
204 first resistor
205 first timer circuit
206 first capacitor
210 input terminal 215 first conduction terminal of first transistor
216 control terminal of first transistor
217 first transistor
218 second conduction terminal of first transistor
300 trigger circuit
301 second diode function
302 first diode function
303 output terminal
304 first resistor
305 first timer circuit
306 first capacitor
310 input terminal
315 first conduction terminal of first transistor
316 control terminal of first transistor
317 first transistor
318 second conduction terminal of first transistor
400 trigger circuit
403 output terminal
410 input terminal
419 electronic device
420 $V_{CC}$ node
421 first conduction terminal of the ESD protection switch
422 ESD protection switch
423 control terminal of the ESD protection switch
424 second conduction terminal of the ESD protection switch
425 output node of the electronic device (connected to ground)
426 Human Body Model (HBM) Electrostatic Discharge (ESD) model
427 terminal for attaching a driver circuit of the electronic device

The invention claimed is:

1. A trigger circuit for controlling an electrostatic discharge (ESD) protection switch; the trigger circuit comprising:

an input terminal arranged to be connected with a first conduction terminal of the ESD protection switch;

an output terminal arranged to control a control terminal of the ESD protection switch;

a first diode function biased from the output terminal to the input terminal;

a second diode function biased from the input terminal to the output terminal and connected in series with the first diode function;

a first transistor having two conduction terminals and a control terminal, wherein the two conduction terminals of the first transistor are arranged in parallel with the first diode function, and wherein the control terminal of the first transistor is configured to control a conduction path between the two conduction terminals of the first transistor;

a first timer circuit comprising a first resistor connected in series between the control terminal of the first transistor and the output terminal; and a first capacitor connected in series between the control terminal of the first transistor and the input terminal;

wherein the second diode function is connected in series between the input terminal and one of the two conduction terminals of the first transistor;

wherein the second diode function is implemented using a separate second diode, and wherein the first capacitor is connected to a cathode of the separate second diode;

wherein the control terminal of the first transistor is coupled via the first capacitor to the input terminal, so that a rising voltage at the input terminal due to an ESD event triggers the control terminal of the first transistor to activate the conduction path between the two conduction terminals of the first transistor; and wherein the first capacitor is arranged to be discharged through the first resistor to the output terminal so that, when the first capacitor is discharged below a first threshold of the first transistor, the control terminal of the first transistor deactivates the conduction path between the two conduction terminals of the first transistor.

2. The trigger circuit of claim 1, wherein the first capacitor has a charge capacity and a relationship between the charge capacity and the first threshold of the first transistor, and wherein the first transistor has a gate capacitance that is configured to keep the first transistor activated for at least a duration of the ESD.

3. The trigger circuit of claim 1, wherein the first transistor is a laterally-diffused metal-oxide semiconductor (LDMOS) or an extended drain field-effect transistor (EDFET).

4. The trigger circuit of claim 1, wherein the ESD protection switch comprises a transistor having a maximum drain-to-source voltage rating of substantially 18 V and/or a maximum gate-to-source voltage rating of substantially 5.5 V.

5. The trigger circuit of claim 1, wherein the first capacitor has a charge capacity of at least 18 V.

6. The trigger circuit of claim 1, wherein the output terminal is configured to float when the conduction path between the two conduction terminals of the first transistor is deactivated.

7. The trigger circuit of claim 1, wherein the second diode function is implemented using a separate second diode, and wherein the first capacitor is connected to an anode of the separate second diode.

8. The trigger circuit of claim 1, further comprising a second transistor having two conduction terminals and a control terminal, wherein the two conduction terminals of the second transistor are arranged in parallel with the second diode function, and wherein the control terminal of the second transistor is configured to control a conduction path between the two conduction terminals of the second transistor; and a second timer circuit;

wherein the second timer circuit comprises:

a second resistor connected in series between the control terminal of the second transistor and the input terminal; and a second capacitor connected in series between the control terminal of the second transistor and the input terminal, and connected in parallel with the second resistor;

wherein the control terminal of the second transistor is connected via the first capacitor to the control terminal of the first transistor;

wherein the control terminal of the second transistor is coupled via the second capacitor to the input terminal, so that a rising voltage at the input terminal due to an ESD event triggers the control terminal of the second transistor to activate the conduction path between the two conduction terminals of the first transistor; and wherein the second capacitor is arranged to be discharged through the second resistor to the input terminal so that, when the second capacitor is discharged below a second threshold of the second transistor, the control terminal of the second transistor deactivates the conduction path between the two conduction terminals of the second transistor.

9. The trigger circuit of claim 8, wherein the second diode function is implemented using a parasitic diode of the second transistor.

10. The trigger circuit of claim 1, wherein the ESD protection switch comprises a transistor having a maximum drain-to-source voltage rating of substantially 18 V and/or a maximum gate-to-source voltage rating of substantially 5.5 V.

11. The trigger circuit of claim 1, wherein the first capacitor has a charge capacity of at least 18 V.

12. A trigger circuit for controlling an electrostatic discharge (ESD) protection switch; the trigger circuit comprising:

an input terminal arranged to be connected with a first conduction terminal of the ESD protection switch;

an output terminal arranged to control a control terminal of the ESD protection switch;

a first diode function biased from the output terminal to the input terminal;

a second diode function biased from the input terminal to the output terminal and connected in series with the first diode function;

a first transistor having two conduction terminals and a control terminal; wherein the two conduction terminals of the first transistor are arranged in parallel with the first diode function, and wherein the control terminal of the first transistor is configured to control a conduction path between the two conduction terminals of the first transistor;

a first timer circuit comprising a first resistor connected in series between the control terminal of the first transistor and the output terminal; and a first capacitor connected in series between the control terminal of the first transistor and the input terminal;

wherein the second diode function is connected in series between the input terminal and one of the two conduction terminals of the first transistor;

wherein the control terminal of the first transistor is coupled via the first capacitor to the input terminal, so that a rising voltage at the input terminal due to an ESD event triggers the control terminal of the first transistor to activate the conduction path between the two conduction terminals of the first transistor; and wherein the first capacitor is arranged to be discharged through the first resistor to the output terminal so that, when the first capacitor is discharged below a first threshold of the first transistor, the control terminal of the first transistor deactivates the conduction path between the two conduction terminals of the first transistor;

a second transistor having another two conduction terminals and another control terminal, wherein the other two conduction terminals of the second transistor are arranged in parallel with the second diode function, and wherein the other control terminal of the second transistor is configured to control a conduction path between the two other conduction terminals of the second transistor; and a second timer circuit;

wherein the second timer circuit comprises;

a second resistor connected in series between the control terminal of the second transistor and the input terminal; and a second capacitor connected in series between the control terminal of the second transistor and the input terminal and connected in parallel with the second resistor;

wherein the other control terminal of the second transistor is connected via the first capacitor to the control terminal of the first transistor;

wherein the other control terminal of the second transistor is coupled via the second capacitor to the input terminal, so that a rising voltage at the input terminal due to an ESD event triggers the other control terminal of the second transistor to activate the conduction path between the two conduction terminals of the first transistor; and wherein the second capacitor is arranged to be discharged through the second resistor to the input terminal so that, when the second capacitor is discharged below a second threshold of the second transistor, the other control terminal of the second transistor deactivates the conduction path between the other two conduction terminals of the second transistor.

13. The trigger circuit of claim 12, wherein the second capacitor has a charge capacity and a relationship between the charge capacity and the second threshold of the second transistor is configured to keep the first transistor activated for at least a duration of the ESD.

14. The trigger circuit of claim 12, wherein the second transistor is a laterally-diffused metal-oxide semiconductor (LDMOS) or an extended drain field-effect transistor (EDFET).

15. The trigger circuit of claim 12, wherein the first diode function is implemented using a parasitic diode of the first transistor.

16. The trigger circuit of claim 12, wherein the second transistor is a laterally-diffused n-channel metal-oxide semiconductor (LDnMOS) or an extended drain field-effect transistor (EDFET).

17. The trigger circuit of claim 12, wherein the first transistor is a laterally-diffused n-channel metal-oxide semiconductor (LDnMOS) or an extended drain field-effect transistor (EDFET).

18. The trigger circuit of claim 12, wherein the first transistor is a laterally-diffused metal-oxide semiconductor (LDMOS) or an extended drain field-effect transistor (EDFET).

19. The trigger circuit of claim 12, wherein the second diode function is implemented using a parasitic diode of the second transistor.

* * * * *